United States Patent [19]

Owen

[11] Patent Number: 4,812,661
[45] Date of Patent: Mar. 14, 1989

[54] METHOD AND APPARATUS FOR HYBRID I.C. LITHOGRAPHY

[75] Inventor: Geraint Owen, Palo Alto, Calif.

[73] Assignee: Hewlett-Packard Company, Palo Alto, Calif.

[21] Appl. No.: 898,451

[22] Filed: Aug. 20, 1986

[51] Int. Cl.$^4$ .............................................. H01J 37/304
[52] U.S. Cl. ............................... 250/491.1; 250/492.2; 250/398
[58] Field of Search .................. 250/491.1, 492.2, 398, 250/492.3

[56] References Cited

U.S. PATENT DOCUMENTS

| | | | |
|---|---|---|---|
| 4,390,788 | 6/1983 | Hayashi et al. | 250/491.1 |
| 4,443,703 | 4/1984 | Shimazu et al. | 250/492.1 |
| 4,603,473 | 8/1986 | Suemitsu et al. | 250/491.1 |

Primary Examiner—Bruce C. Anderson
Assistant Examiner—Jack I. Berman

[57] ABSTRACT

A method and apparatus for hybrid integrated circuit lithography wherein an E-beam lithographic exposure is accurately aligned with a preexisting optical lithographic exposure. In one embodiment, the method includes deflecting an E-beam to chip marks while holding the integrated circuit substantially stationary to determine a plurality of deflector parameters, and then moving the integrated circuit while holding the E-beam substantially stationary to determine a number of stage parameters. In a second embodiment, the chip marks are accessed by a combination of stage movements and deflector movements to determine a number of compound parameters. The stage and deflector parameters or, alternatively, the compound parameters, are used to convert the pattern data base of an E-beam machine into a transformed data base which accurately matches the E-beam exposure to the optical exposure.

32 Claims, 7 Drawing Sheets

FIG 11A LINEAR DISTORTION

FIG 11B BARREL DISTORTION

FIG 11C TRAPEZOIDAL DISTORTION

METHOD AND APPARATUS FOR HYBRID I.C. LITHOGRAPHY

BACKGROUND OF THE INVENTION

1. Field of the Invention

This invention relates generally to methods for manufacturing integrated circuits, and more particularly to optical and E-beam lithography methods used during the manufacture of integrated circuit devices.

2. Description of the Prior Art

Integrated circuit chips are generally produced, in bulk, on semiconductor wafers. A semiconductor wafer is, most commonly, a thin, disk-shaped piece of highly-polished, crystalline silicon. The wafer serves as a base or substrate for subsequent layers of semiconductive, insulating, and conductive materials which comprise an integrated circuit chip.

Crucial to the production of the various layers of an integrated circuit chip is a process known as lithography. In this process, a reactive film, such as photoresist, is applied to a wafer, and is subsequently exposed to some form of radiation. The reactive film undergoes chemical reactions which differentiate the portions of the film that were exposed to the radiation from the unexposed portions of the film. The film can then be chemically processed to remove differentiated portions of the film, leaving a pattern or mask on the the upper surface of the wafer for subsequent processing steps.

Currently, the most common form of integrated circuit lithography is known as "optical" lithography which exposes photoresist to radiation in the visible and ultraviolet (U.V.) regions. Far less common is electron beam or "E-beam" lithography which uses a beam of electrons to expose a reactive film. Other forms of lithography, such as "X-ray" lithography, are also known, but are rarely used except in experimental applications Optical lithography is a fairly mature technology, and is well-adapted for full-scale mass production of semiconductor devices. With optical lithography, a reticle or mask is made having the pattern of a particular layer on a semiconductor wafer. Electromagnetic radiation in the visible or U.V. range is projected through the mask or reticle onto a film of photoresist which has been applied over the top surface of a semiconductor wafer. The photoresist is then developed in preparation for subsequent processing steps.

While optical lithography, as mentioned previously is well-adapted for full-scale mass production, it is presently limited to producing integrated circuit devices having feature sizes of approximately 0.8 microns or larger. This limiting factor is due to diffraction problems caused by the relatively long wavelengths of visible and ultraviolet light. As circuit designers develop denser integrated circuit devices with smaller feature sizes and more components per unit area, it becomes increasingly important to be able to produce integrated circuit chips having feature dimensions that are a small fraction of a micron.

Smaller feature sizes can be produced by using lithography processes which have higher resolution than optical lithography. E-beam lithography, due to the short wavelength of electron beams, is well-suited to this purpose. Furthermore, E-beam lithography has the advantage of not requiring masks or reticles to produce a pattern on the reactive film. Instead, a "pattern" data base is stored within a digital memory of an E-beam device, and an E-beam is scanned across a surface of the wafer in accordance with the pattern by means of electrostatic or electromagnetic deflectors.

Despite the many advantages of E-beam lithography, it is a relatively slow process and thus is not well suited for the mass production of integrated circuit devices. This is due, in part, to the fact that direct-write E-beam lithography is a sequential process involving the scanning of an electron beam across the surface of the wafer to form a pattern; as opposed to the single step process of optical lithography, where substantial areas of the wafer are exposed simultaneously to form a pattern. In consequence, E-beam lithography is used commercially only for low volume, specialized devices.

In order to gain advantages of both optical lithography and E-beam lithography, "hybrid" lithography techniques have been developed. With hybrid lithography, some features of an integrated circuit are exposed by optical lithography techniques, while other features are exposed by E-beam lithography techniques.

The major problem encountered in hybrid lithography is that of registration between the optically exposed features and the E-beam exposed features. Due to imperfections of the optics used for optical lithography, the optically formed features are distorted and therefore do not correspond to the idealized pattern stored in the pattern data base of the E-beam lithography machine. As integrated circuit feature sizes become smaller, there is an increasing likelihood that there will be a failure of the registration between the distorted, optically formed features and subsequent E-beam formed features, resulting in an inoperative device.

As mentioned previously, optical distortion during the optical lithography step is one source of registration error in hybrid lithography. Another source of registration error is due to cumulative stage movement errors of the X-Y stage which supports the semiconductor wafer.

Historically, the first step towards solving the registration problem was the matching of an E-beam deflector to the optically patterned wafer. For example, in an article entitled "Device Fabrication with the Stereoscan" of Wolf, et al., teaches the manual use of registration marks in electron lithography. Other articles teaching the matching of an E-beam deflector to a wafer include "Automatic Patterning Position of Scanning Electron Beam Exposure" of Mivauchi, et al., IEEE Transactions on Electron Devices, Vol. E-D-17, No. 6 (1970); and "Electron Beam Fabrication of Micron Transistors" of Magdo, et al., IBM, J. Res. Develop. Paper (1971).

Another article, "Computer-Controlled Scanning Electron Microscope System for High-Resolution Microelectronic Pattern Fabrication" of Ozdemir, et al., IEEE Transactions on Electron Devices, Vol. E-D-19, No. 5 (1972) teaches a method of hybrid lithography in multi-field chips. Ozdemir, et al. circumvented the problem of calibrating the stage to the optically-formed pattern by placing registration marks within the chip itself. While this technique works, it is not particularly desirable since it occupies valuable chip real estate and reduces the maximum density of an integrated circuit device.

Other articles pertaining to the registration problem include "E-Beam Writing Techniques for Semiconductor Device Fabrication" of Varnell, et al., Journal of Vacuum Science Technology, Volume 10, No. 6 (1973), and "Automatic Registration in an Electron-Beam Lithographic System" of Davis, et al., IBM Journal of Research and Development (1977).

Once the data is obtained, by any appropriate means, for matching the E-beam deflector to the optically patterned substrate, the problem remains of transforming the pattern data base of the E-beam lithograph machine. In an article entitled "Computer-Controlled Electron Beam Micro fabrication Machine with a New Registration System" of Saitou, et al., Journal of Physics, E Scientific Instruments 7 (1974), linear matrix transformations are disclosed for this purpose.

Another prior art approach to the registration problem found is the matching of the stage to the deflector of an E-beam lithography device. Frequently, the stage position is determined by means of a laser interferometer, as is described in "High Performance Step and Repeat Machine Using an Electron Beam and Laser Interferometers" of Cahen, et al., 4th International Conference of The Electrochemical Society (1970).

One of the earliest references which describes a stage and deflector matching process is "Control System Design and Alignment Methods for Electron Lithography" by Alles, et al., Journal of Vacuum Science Technology, Vol. 2, No. 6 (1975). While the Alles, et al. article was influential since it was used on a very popular E-beam lithography instrument, it suffered from two major limitations. First, Alles, et al. does not take into account the distortions produced by the beam deflector, and consequently the method can only be used with very small deflection fields. Second, Alles, et al. fails to take into account the effects of variation in substrate height.

In an article entitled "Distortion Correction and Deflection Calibration by Means of Laser Interferometry in an Electron-Beam Exposure System" of Asai, et al., Journal of Vacuum Science Technology, 16(6) (1979), the problems of distortion by the beam deflector were subsequently addressed. In "Distortion Correction and Overlay Accuracies Achieved by the Registration Method Using Two-Stage Standard Mark System" of Takamoto, et al. in the Journal of Vacuum Science Technology, B4(3), 1986, the problem of height variation in the substrate was addressed.

In "A Comparison of Pattern Stitching by Subfield Registration and Laser Interferometer Servo Control" of Wilson, et al., Electron Ion Beam Science and Technology, 8th International Conference Edition (1978) and in a similar article entitled "Stitching with Overlay in Direct Wafer Writing Using Scanning Electron Beam" of Wilson, et al. in the Electron and Ion Beam Science and Technology 9th International Conference (1980), a method is described for using an electron lithography machine for writing multifield hybrid chips. The method involved matching the E-beam stage to the substrate by finding fiducial marks in the optically exposed substrate by moving the stage in a search pattern. In a separate calibration procedure, the stage was matched to the E-beam deflector by methods similar to those previously described.

From the above discussion, it should be apparent that there has been widespread research into the problem of registration between optically-exposed features and E-beam exposed features in hybrid lithography. The Wolf. et al., Mivauchi, et al., Maodo, et al., Ozdemir, et al., Varnell, et al., Saitou, et al., and Davis, et al. articles all address the problem of calibrating an E-beam lithography machine's deflector to an optically-patterned substrate. Alles, et al., Asai, et al., and Takamoto, et al. teach the matching of an E-beam lithography machine's deflector to its stage. Finally, Wilson, et al. in their two articles, describe the matching of an E-beam lithography machine's stage to an optically-patterned substrate.

From the foregoing, it is clear that there has been a long-felt need for a hybrid lithographic process which solves the registration problem. Although some progress towards this goal has been made, the prior art has failed to develop a practical, commercial registration process for use during the manufacture of integrated circuits by hybrid lithographic techniques.

SUMMARY OF THE INVENTION

An object of this invention is to provide a method for aligning an E-beam lithographic exposure of an integrated circuit chip with a pre-existing optical lithographic exposure.

Another object of this invention is to provide a comprehensive method for producing integrated circuit chips by hybrid lithography.

Yet another object of this invention is to provide a practical hybrid lithography machine.

Briefly, a method in accordance with the above-stated objects includes the steps of: sequentially deflecting an E-beam to a number of optically produced chip marks while maintaining the integrated circuit in a substantially stationary position to determine a number of deflector parameters; moving the integrated circuit chip to align the chip marks with a substantially stationary E-beam to determine a number of stage parameters; and finally exposing the integrated circuit chip with the E-beam, using both the deflector parameters and the stage parameters to transform the pattern data base of the E-beam machine so that the E-beam exposure is accurately aligned with the preexisting optical exposure.

An alternate method in accordance with the present invention includes the steps of: sequentially moving the integrated circuit chip until a substantially stationary E-beam is positioned within deflection range of a chip mark, and then deflecting the E-beam to the chip mark to determine a plurality of compound parameters; and exposing the integrated circuit chip with the E-beam using the compound parameters in calculations which transform the pattern data base stored in the E-beam machine. This second method has the advantage of being able to correct for non-linear distortions of the optically exposed features, such as barrel distortion or trapezoidal distortion.

The apparatus of the present invention includes: a stage assembly adapted to support an integrated circuit wafer and move it in an X-Y plane; an E-beam device including an electron source and a deflector mechanism for deflecting the path of an E-beam generated by the electron source; an electron detector responsive to electrons reflected off the semiconductor wafer by the E-beam; a digital storage device for storing a pattern data base and a correction data base; and a digital controller coupled to the stage assembly, the E-beam device, the electron detector, and the storage device. The digital controller uses the stage assembly, the E-beam device, and the electron detector to determine and store data in the correction data base, and then uses both the pattern data base and the correction data base to control the stage assembly and the E-beam mechanism during the subsequent E-beam exposure of the integrated circuit wafer.

A major advantage of the present invention is that it provides both a method and an apparatus for successfully performing hybrid lithography.

These and other objects and advantages of the present invention will be apparent to those skilled in the art after reading the following descriptions and studying the various figures of the drawing.

DETAILED DESCRIPTION OF THE PREFERRED EMBODIMENT(S)

Figure 1:
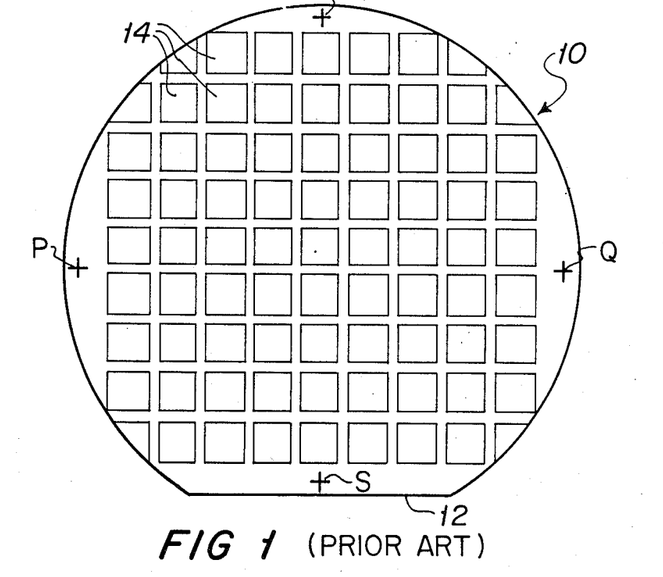
FIG. 1 is a top plan view of a prior art integrated circuit wafer.

Referring to FIG. 1, a semiconductor wafer 10 is a thin, flat, disk-shaped item having one or more registration flats 12. Wafer 10 is generally highly-polished on one or more of its surfaces, and is usually made from one of the common semiconductor materials, such as silicon, germanium, or gallium arsenide.

By processes well known to those skilled in the art, the wafer 10 can be exposed in an optical lithography machine (such as a wafer stepper) to produce a number of integrated circuits 14, as well as a number of wafer registration marks P, Q, R, and S. The wafer registration marks can be used to register a series of optically exposed layers on the wafer 10.

Figure 2:
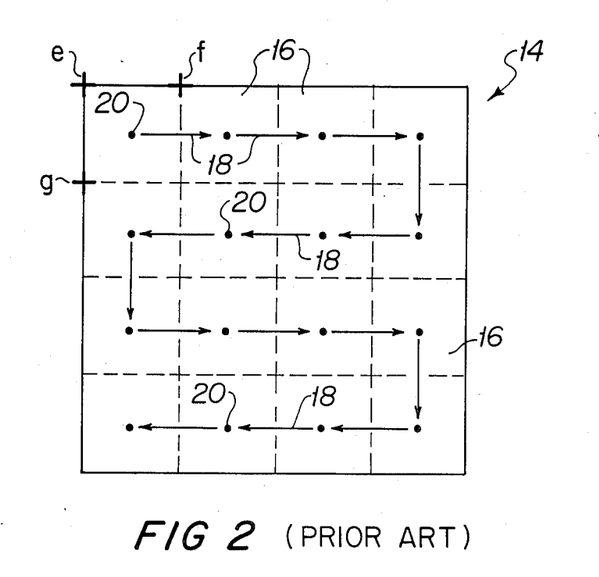
FIG. 2 is an enlarged view of one of the integrated circuit chips shown in FIG. 1.

Referring now to FIG. 2, one of the integrated circuits 14 has been enlarged to show three chip registration marks e, f, and g located near an upper left-hand corner which were formed concurrently with the optically formed features of the integrated circuits 14. An E-beam lithography machine has a rather small exposure field compared to the area of a typical integrated circuit chip. In consequence, the integrated circuits 14 can be thought of as being divided into a number of fields 16 which correspond to a practical E-beam exposure area. While there are sixteen fields 16 illustrated in FIG. 2, more or fewer fields may be provided in an integrated circuit chip 14, depending upon the size of the integrated circuit chip and the size of the E-beam exposure area for a particular E-beam lithography machine.

The E-beam exposure of an integrated circuit chip 14 is accomplished one field 16 at a time, and generally follows a pattern as suggested by the arrows 18. An E-beam is first positioned near a center 20 of a field 16, and then the beam is scanned across the field to produce E-beam exposed features. Once a field 16 is fully exposed, the stage upon which the wafer 10 rests is moved to position the E-beam in the center 20 of an adjacent field 16, where the process is repeated.

Figure 3:
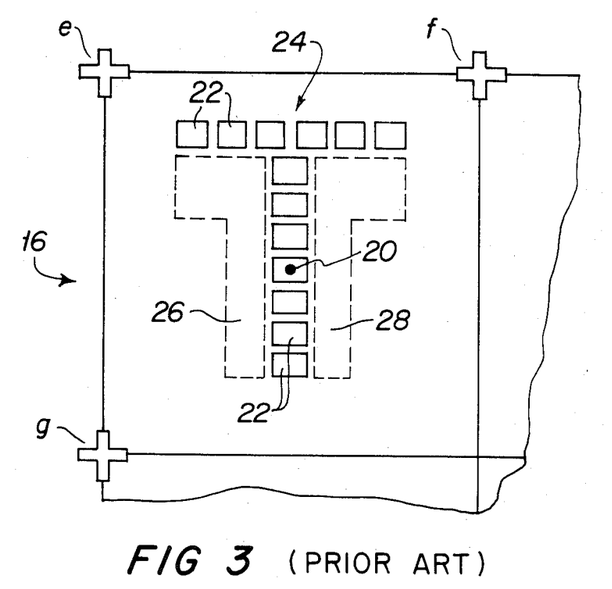
FIG. 3 is an enlarged view of a portion of the integrated circuit chip shown in FIG. 2.

In FIG. 3, a field 16 of an integrated circuit chip 14 is shown in a magnified form. The chip marks e, f, and g are typically cross-shaped, and are orthogonally arranged to form a right angle gef. The E-beam, as it is scanned back and forth across the field 16, produces a number of "shots" or "flashes" 22 to form an E-beam exposed feature. In the particular case shown in FIG. 3, an E-beam exposed feature 24 is substantially T-shaped, and is comprised of a series of the flashes 22. To produce an operational integrated circuit chip, the E-beam exposed features 24 must be properly aligned with the optically exposed features 26 and 28, as illustrated in broken lines.

Figure 4:
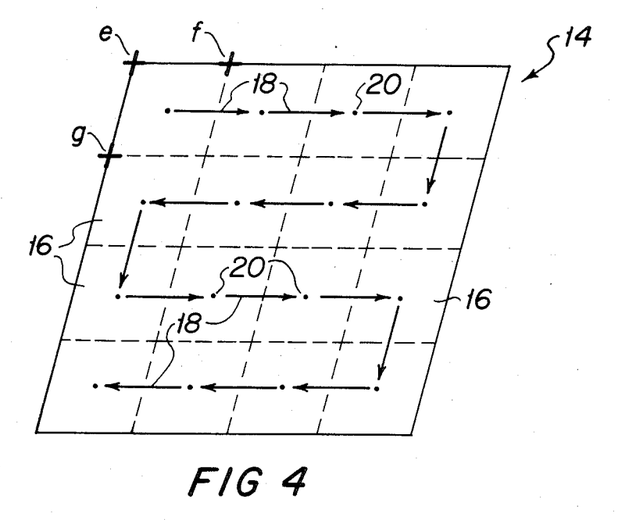
FIG. 4 is a top plan view of an integrated circuit chip similar to the one shown in FIG. 2, but which has been distorted during the optical lithography step.

If the optically exposed features produced by the optical lithographic steps are relatively undistorted and correspond closely to the pattern data base in the E-beam lithography machine, and if there are minimal stage and deflector errors, the E-beam exposed features should be properly aligned with the pre-existing optically exposed features. Unfortunately, this is rarely the case. As illustrated in FIG. 4, an integrated circuit chip 14 produced by an optical lithography process is often distorted, precluding proper alignment with the E-beam exposed features.

In FIG. 4, the integrated circuit chip 14 has taken the form of a rotated, shifted parallelogram. The method of the present invention determines the magnitude and direction of the various distortions, and transforms the stored pattern data base to compensate for the distortions. Once the transforms have been determined, the E-beam exposure of the fields 16 can proceed as previously described with reference to FIG. 2.

In order to accomplish the above-mentioned purpose of aligning the E-beam exposed features with the optically exposed features, it is important to perform three major steps. First, the deflector of the E-beam lithography machine must be sequentially deflected to the chip marks to determine a number of deflector parameters. Second, the stage of the E-beam lithography machine must be used to determine a number of stage parameters. Finally, the deflector parameters and stage parameters must be used to transform the stored pattern data base of the E-beam lithography machine so that the E-beam exposed features will be correctly aligned with the pre-existing optically exposed features.

It should be noted that steps 1 and 2 as described above could be equally well done in the opposite order. In other words, it does not matter in which order the stage parameters or he deflector parameters are gathered. Also, as will be discussed in greater detail with reference to an alternate embodiment of the present invention, stage parameters and deflector parameters can also be determined concurrently as "compound" parameters.

Figure 5:
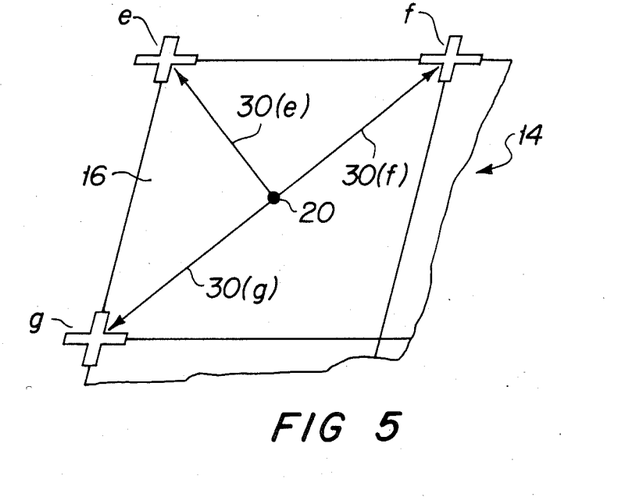
FIG. 5 is an enlarged view of a portion of FIG. 4, and is used to illustrate the alignment of the E-beam deflector with the integrated circuit chip.

Referring now to FIG. 5, a method for determining the deflection parameters of an integrated circuit chip 14 is illustrated. First, an E-beam is positioned at the center 20 of the field 16 closest to chip marks e, f, and g. The E-beam is then sequentially deflected to the marks e, f, and g, as indicated by the arrows 30(e), 30(f), and 30(g). Since the E-beam lithography machine knows the direction and magnitude of the deflections 30(e), 30(f), and 30(g), it will be quite apparent to those skilled in the art that the deflector parameters can be calculated by comparing the actual position of chip marks e, f, and g, to the idealized position of the chip marks e, f, and g stored in the pattern data base of the E-beam lithography machine.

Figure 6A:
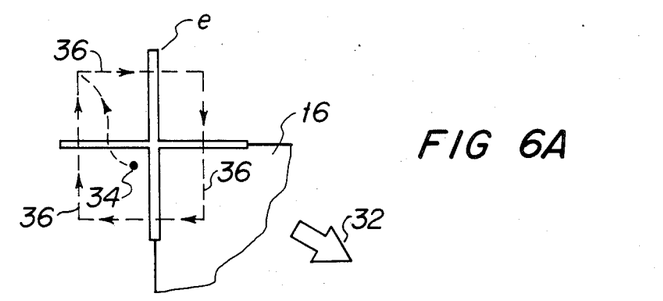
FIGS. 6A and 6B illustrate two alternate methods for aligning the E-beam stage with the integrated circuit chip.

In FIG. 6A, a method for obtaining the stage parameters is illustrated. Here, the stage upon which the semiconductor wafer 10 is supported is moved as indicated by arrow 32 in an attempt to align a stationary E-beam spot 34 with a chip mark, such as chip mark e. As seen in the figure, the stage movement alone did not exactly align the stationary E-beam spot 34 with the center of chip mark e. Therefore, the E-beam is very slightly deflected in a search pattern, such as the square search pattern indicated in broken line arrows 36, to gather information concerning the location of the center of the chip mark e. Since the E-beam deflections, as indicated by arrows 36, are very small, the error in determining the stage parameters due to the E-beam deflection is negligible. To calculate the stage parameters, calculations derived from the small E-beam deflections are added to calculations derived from the much larger stage movements.

Figure 6B:
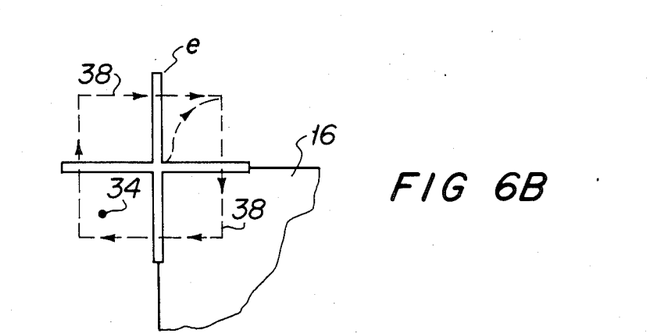

In FIG. 6B, an alternate method for obtaining the stage parameters is illustrated. In this embodiment, the stage is moved in an attempt to align a chip mark e with a substantially stationary E-beam spot 34. The stage itself is then moved in a search pattern, such as the square search pattern indicated by broken line arrows 38, to gather information concerning the location of the center of chip mark e to allow the calculation of the stage parameters.

Figure 7:
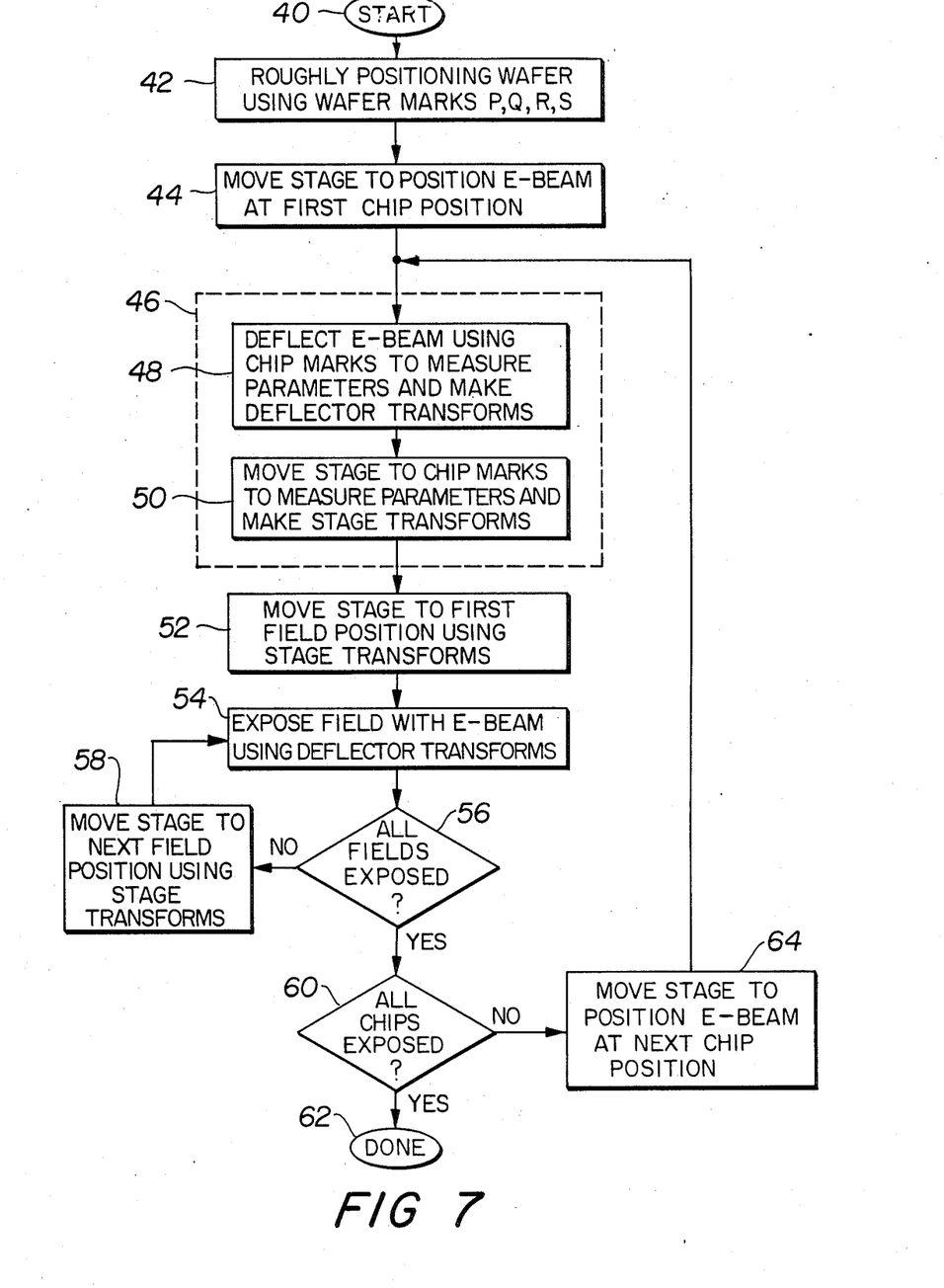
FIG. 7 is a flow chart showing the method steps to make an E-beam exposure of all of the integrated circuit chips on a wafer in alignment with a pre-existing, optical exposure.

The steps of the present invention are illustrated in flow chart form in FIG. 7. After the initiation of the process indicated by block 40, the wafer is roughly positioned using wafer marks P, Q, R, and S as indicated in block 42. Next, the stage is used to position the E-beam at a first chip position as indicated by block 44. The method steps of blocks 40, 42, and 44, are well-known to those skilled in the art of hybrid lithography.

In the large block 46 (shown in broken lines) a pair of blocks 48 and 50 correspond to the steps of determining he deflection parameters and the stage parameters, respectively. Once the deflector parameters and stage parameters have been determined, the E-beam stage can be moved to a first field position using the stage transforms and the pattern data base as indicated by block 52. The field is then E-beam exposed using the deflector transforms and the pattern data base as indicated by block 54. When a particular field has been fully exposed, decision block 56 is performed, and if not all of the fields have been exposed the E-beam stage is moved to position the next field under the E-beam as indicated by block 58. The process steps of block 54, 56, and 58 are repeated until all of the fields of a particular integrated circuit chip have been exposed. At that time, decision block 60 is performed, and if all of the chips on the wafer 10 have been exposed the process is completed, as indicated by block 62. If all of the chips have not yet been E-beam exposed, stage is moved to position the E-beam at the next chip position, as indicated by block 64, and the process is repeated starting at block 46.

Figure 8:
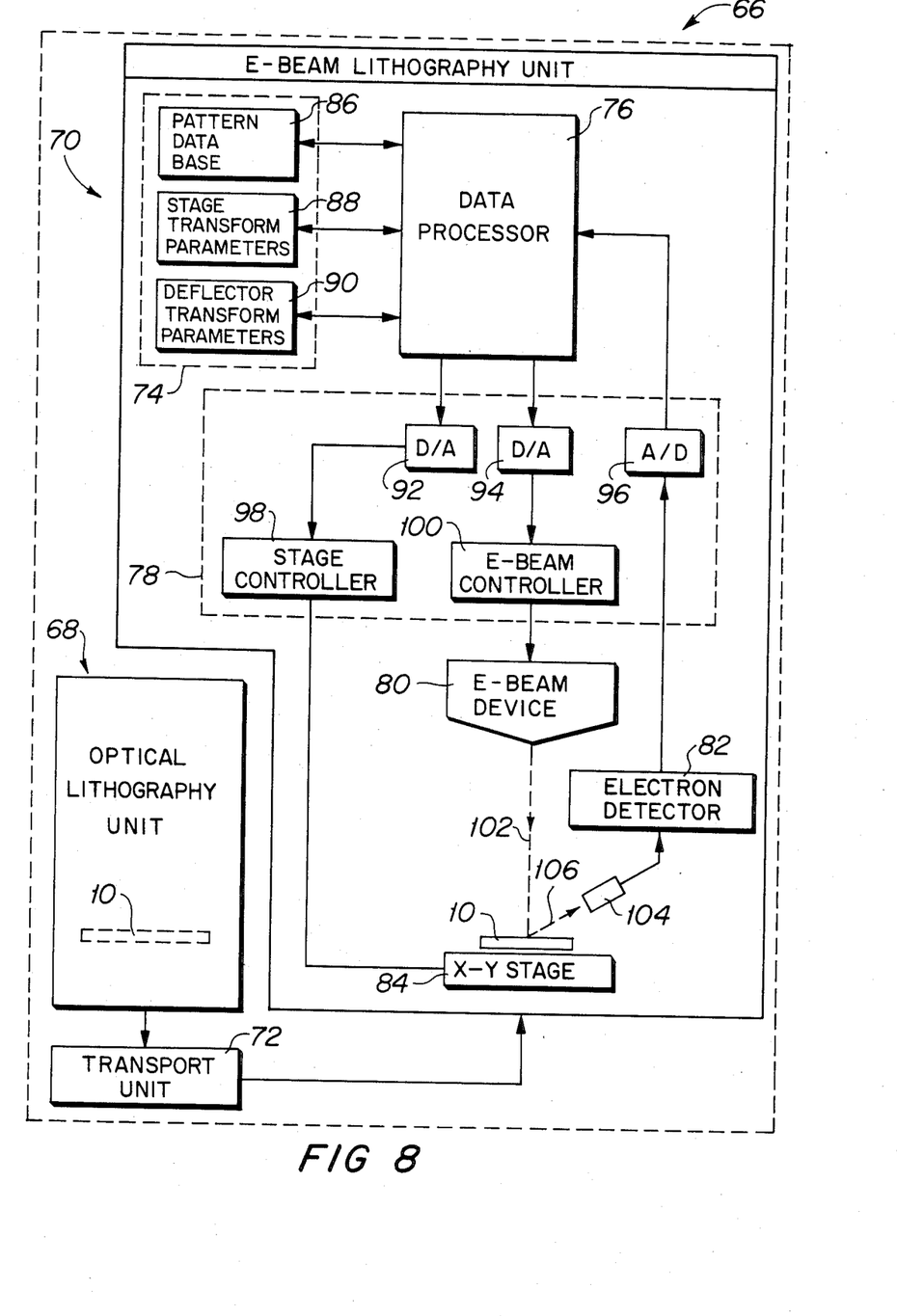
FIG. 8 is a block diagram of a hybrid lithography machine in accordance with the present invention.

Referring now to FIG. 8, an apparatus 66 for hybrid lithography includes an optical lithography unit 68, an E-beam lithography unit 70, and a transport unit 72. The optical lithography unit is of conventional design and can produce optically-exposed features on a semiconductor wafer 10. The transport unit 72 can be an automatic mechanism for transferring wafer 10 from the optical lithography unit 68 to the E-beam lithography unit 70, or it may comprise a simple wafer holder which is hand-carried between the optical lithography unit 68 and the E-beam lithography unit 70.

E-beam lithography unit 70 includes memory 74, a data processor 76, an interface unit 78, an E-beam device 80, an electron detector 82 (sometimes known as a "Back Scattered Electron" or "BSE" detector), and an X-Y stage 84. The semiconductor wafer 10 is placed on the X-Y stage 84 by the transport unit 72.

Memory 74 is preferably a read/write memory such as RAM and includes a pattern data base 86, stage transform parameter data base 88, and deflector transform parameter data base 90. The pattern data base 86 can be loaded from a non-volatile memory device, such as a tape drive unit or a disk drive unit (not shown).

Data processor 76 is coupled to memory 74 so that it can read from and write to the various data bases stored within the memory. As will be discussed in greater detail subsequently, data processor 76 controls X-Y stage 84 with data derived from the pattern data base which is modified or transformed by the stage transform parameters stored in data base 88. Likewise, the data processor 76 controls the E-beam beam device 80 by means of data derived from pattern data base 86 as modified or transformed by the deflector transform parameter stored in data base 90. Data processor 76 can be of conventional digital computer design, and may include one or more microprocessors.

Interface unit 78 includes Digital-to-Analog or D/A devices 92 and 94, and an Analog-to-Digital or A/D device 96. The interface unit also includes a stage controller 98, and an E-beam controller 100.

An output of data processor 76 is coupled to X-Y stage 84 by D/A 92 and stage controller 98. Another output of data processor 76 is coupled to the E-beam device 80 by D/A 94 and E-beam controller 100. The electron detector 82 is coupled to an input of data processor 76 by A/D 96.

E-beam device 80 includes an electron source and an E-beam deflector (not shown). When activated, the E-beam device produces an E-beam 102 which can be aimed by means of the deflectors of the E-beam device 80. By deflecting E-beam 102, it is possible to create the aforementioned flashes on the reactive film which was previously applied to the surface of wafer 10.

Electron detector 82 includes a sensor 104 which can detect a scattered or reflected portion 106 of E-beam 102. The data processor 76 analyzes the signal produced by electron detector 82 to determine whether E-beam 102 is impinging upon a wafer marks P, Q, R, and S, or a chip marks e, f, or g.

In use, a wafer 10 is placed within the optical lithography unit so that optically produced features including wafer registration marks and chip registration marks are produced. The wafer 10 is then transported to X-Y stage 84 of E-beam lithography unit 70 and placed roughly in position. The data processor 76 controls the E-beam device 80 and the X-Y stage 84, and senses the output of electron detector 82 to find the wafer registration marks P, Q, R, and S At this point, the data processor 76 has enough information to know, fairly well, the position of the individual integrated circuit chips.

The data processor 76 then causes the X-Y stage 84 to move wafer 10 such that E-beam 102 is positioned near the center of a first integrated circuit chip. The E-beam device 80 and electron detector 82 are used to find the chip registration marks e, f, and g, and the data processor stores the deflector transform parameters in data base 90. Next, the data processor 76 causes the X-Y stage 84 to move in an attempt to align the substantially stationary E-beam 102 with the chip marks e, f, and g, and uses the input from electron detector 82 to determine when the E-beam is aligned with the chip marks. The data processor 76 stores this information in the stage transform parameter data base 88. Once the stage transform parameters and deflector transform parameters have been stored in data bases 88 and 90, respectively, the data processor 76 can transform the pattern data base to properly control the X-Y stage 84 and E-beam device 80 to successfully perform hybrid lithography on the integrated circuits of wafer 10.

As discussed thus far, three chip registration marks e, f, and g have been used to gather data for the stage transform parameters and the deflector transform parameters. The three chip registration marks were arranged in the form of a right angle in the upper left-hand corner of a particular integrated circuit chip. While this arrangement has the advantage of simplicity, it suffers from several drawbacks. First, the assumption is being made that the distortion caused by the optical lithography process is linear in nature. In actuality, optical lithography machines produce many non-linear distortions which cannot be detected using only three chip marks. Second, since the chip marks are located at only one portion of the chip, the stage and deflector transforms developed from the chip marks may not apply to other portions of the chip. For example, with the chip marks located in the upper left-hand corner of the chip, the lower right-hand corner field may have very poor alignment between the optically formed features and the E-Beam formed features. Third, when the three chip marks are each individually accessed by both stage movements and E-beam deflection, redundant data is developed which slows down the speed of the hybrid lithography process. It has been determined that only five data pairs are required to fully characterize the linear distortions to the integrated circuits, and the use of three chip marks each accessed by both stage movements and E-beam deflection produces six data pairs.

Figure 9:
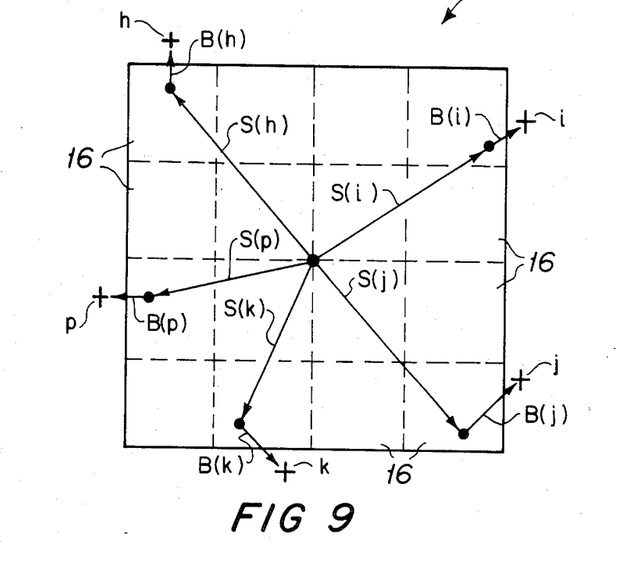
FIG. 9 illustrates an alternate method in accordance with the present invention for obtaining alignment correction data for the purpose of hybrid lithography.

With reference to FIG. 9, a second method is illustrated for obtaining the stage transform parameters and the deflector transform parameters. In this method, a minimum of five chip marks labeled h, i, j, k, and p are provided at arbitrary positions around the integrated circuit chip 14. By spreading out the chip marks, the distortion across the integrated circuit chip 14 is averaged, so that all of the fields 16 will have substantially the same degree of alignment between the optically-exposed features and the E-beam exposed features. Also, by using five chip marks the required five data pairs can be obtained without redundancy.

The method illustrated in FIG. 9 involves first parking the E-beam spot near the center 20 of an integrated circuit chip 14. The X-Y stage is then activated to move a substantially stationary E-beam spot within deflection distance of a chip mark. Next, the E-beam is deflected the remainder of the way to the chip mark to obtain compound parameters which include information about the stage movement and the deflector movement that were required to access the chip mark.

For example, to obtain the compound parameters for chip mark h, the stage is moved such that the E-beam spot is shifted as suggested by S(h), and the E-beam is then deflected the remainder of the way to the chip mark h as suggested by B(h). Similar stage movements and E-beam deflections are made for the remaining chip marks i, j, k, and p.

Figure 10:
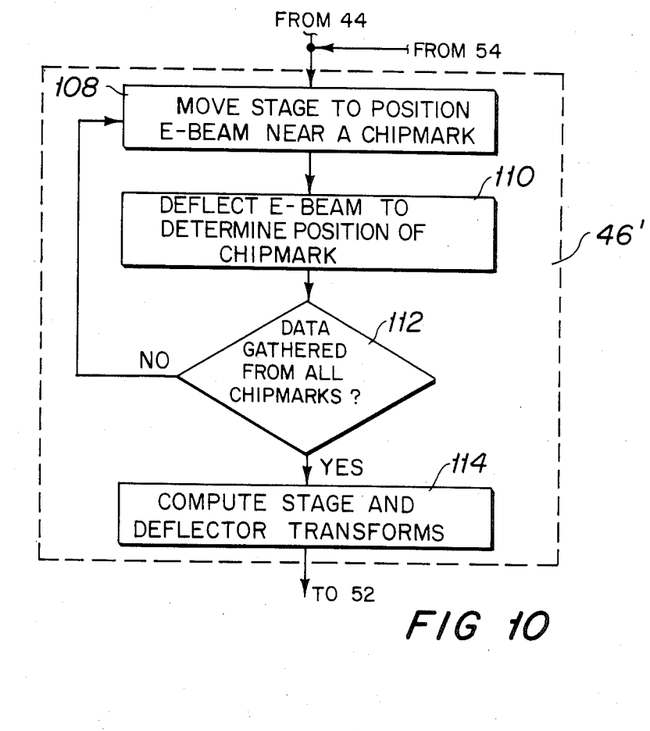
FIG. 10 is a block diagram showing the steps illustrated in FIG. 9.

This second method is further illustrated in flow chart form in FIG. 10. The block 46' replaces the block 46 shown in FIG. 7. Briefly, in block 108, the stage is moved to position the E-beam near a chip mark. Then, in block 110, the E-beam is deflected to determine the exact position of the chip mark. In decision block 112, it is determined whether data has been gathered from all five chip marks. If all of the data has not been gathered, the steps of blocks 108, 110, and 112 are repeated. If data has been gathered from all of the chip marks, the stage and deflector transforms are calculated as indicated in block 114.

Figure 11A:
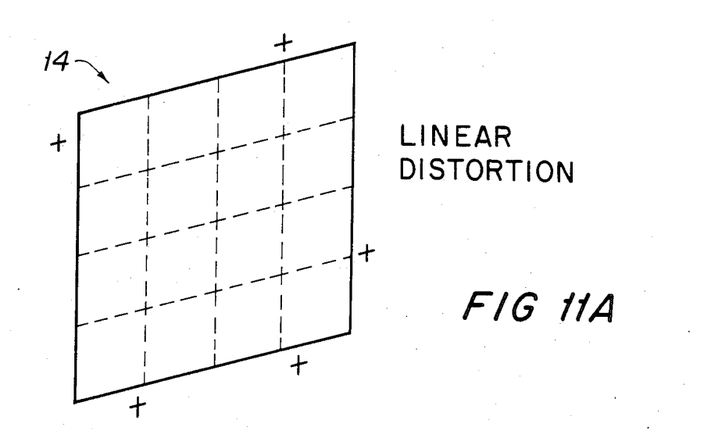
FIGS. 11A, 11B, and 11C illustrate various distortions which may occur during optical lithographic exposure.
Figure 11B:
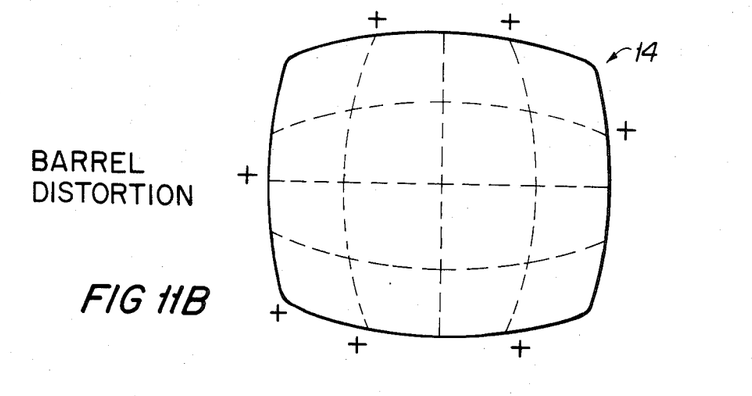
Figure 11C:
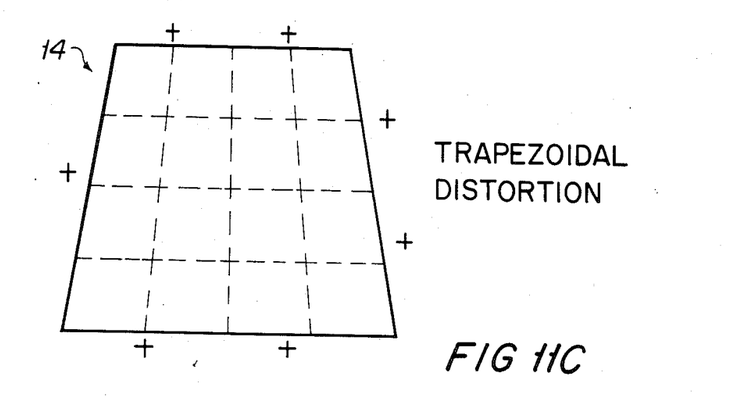

Various distortions which can be produced in the optical lithography step are illustrated in FIGS. 11A, 11B, and 11C. In FIG. 11A, a linear distortion is illustrated where the integrated circuit chip 14 takes the form of a shifted, rotated, parallelogram. For this type of linear distortion, five chip marks are sufficient to fully characterize the distortion. On the other hand, for non-linear distortions such as the barrel distortion illustrated in FIG. 11B or the trapezoidal distortion illustrated in FIG. 11C, a minimum of seven chip marks are required to produce seven data pairs of information. Of course, a combination of distortions such as barrel and trapezoidal distortion can also occur, which would require even more chip marks. It can be good practice to use a fairly large number of chip marks around each integrated circuit chip 14 to gather data with some degree of redundancy. In fact, any number of marks greater than or equal to the minimum number necessary can be used for the registration process, because the method of the present invention is based upon least-square-error parameter fitting.

Once the stage parameters and deflector parameters have been gathered, the task remains of transforming the pattern data base of the E-beam lithography unit. Of. course, there are many ways to mathematically transform the pattern data base, as will be appreciated by those skilled in the art. For the purpose of example, two such methods will be discussed, where the first will transform the pattern data base based upon information gathered by the process illustrated in block 46 in FIG. 7, while the second will be discussed with reference to the method indicated in block 46' in FIG. 10. Both of these methods assume linear distortion, and the transforms take the form of matrix operations.

In order to discuss the mathematics of the transforms, it is useful to first define the notation shown in Table 1.

TABLE 1

| | |
|---|---|
| [X(s), Y(s)] | Pattern Stage Coordinates |
| [X(d), Y(d)] | Pattern Deflector Coordinates |
| [X'(s), Y'(s)] | Transformed Stage Coordinates |
| [X'(d), Y'(d)] | Transformed Deflector Coordinates |

The object of the transformation is to convert pattern stage coordinates into transformed stage coordinates, and pattern deflector corrdinates into transformed deflector coordinates. The matrix formulation indicated below in Table 2 can be used for this purpose.

TABLE 2

$$\begin{bmatrix} X'(s) \\ Y'(s) \end{bmatrix} = [M(s)] \begin{bmatrix} X(s) - \Delta X \\ Y(s) - \Delta Y \end{bmatrix}$$

and $$\begin{bmatrix} X'(d) \\ Y'(d) \end{bmatrix} = [M(d)] \begin{bmatrix} X(d) \\ Y(d) \end{bmatrix}$$

where
[M(s)] is the stage matrix of Table 3;
[M(d)] is the deflector matrix of Table 4; and
[$\Delta X$, $\Delta Y$) is the offset error.

Of course, the offset error could be equally well entered into the deflector equation, or could be used redundantly in both the deflector and the stage equation. The problem remains, for both the first and the second registration methods, of finding [M(s)], [M(d)], and $\Delta X$, $\Delta Y$.

With the first registration method which uses the three chip marks, the transformed deflector coordinates are arbitrarily set to X'(d)=Y'(d)=0. The e, f, and g marks are then accessed using the stage movements as previously described. The stage matrix [M(s)] and ($\Delta X$, $\Delta Y$) are then determined as indicated in Table 3 from the known values of X(s) and Y(s) corresponding to the e, f, and g marks, and the measured values of X'(s) and Y'(s) corresponding to those marks.

TABLE 3

$$[M(s)] = \begin{bmatrix} a' & -n' \\ m' & b' \end{bmatrix}$$

where
a' = scale change in X;
b' = scale change in Y;
m' = rotational error of X axis; and
n' = rotational error of Y axis.

The stage control coordinates are set to position the E-beam spot at any convenient location with deflection distance of the e, f, and g chip marks. The deflector is then used to sequentially access the e, f, and g marks to calculate [M(d)] as indicated in Table 4 from the known values of X(d) and Y(d) corresponding to the e, f, and g marks, and the measured values X'(d) and Y'(d) corresponding to those marks.

TABLE 4

$$[M(d)] = \begin{bmatrix} a & -n \\ m & b \end{bmatrix}$$

where
a = scale change in X;
b = scale change in Y;
m = rotational error of X axis; and
n = rotational error of Y axis.

It should be noted that in the calculation of [M(d)] it is sufficient to access only the f and g marks using the deflector. This will allow the value of [M(d)] to be calculated, although it does not allow the calculation of $\Delta X$ and $\Delta Y$. However, $\Delta X$ and $\Delta Y$ had already been obtained from the calculation of [M(s)]. Also, it should be noted that in the calculation of [M(s)], that X'(d) and Y'(d) do not have to be set to zero, although setting them to zero does simplify subsequent calculations.

For the second registration method as shown in FIGS. 9 and 10, the calculations of the stage transforms and deflector transforms are somewhat more complex. As was explained previously, five or more marks should be accessed by a combination of stage movements and deflector movements. For the $i^{th}$ mark, the terminology of Table 5 will be used:

Table 5

[X(s,i), Y(s,i)] = pattern stage coordinates;
[X(d,i), Y(d,i)] = pattern deflector coordinates;
[X'(s,i), Y'(s,i)] = actual stage coordinates; and
[X'(d,i), Y'(d,i)] = actual deflector coordinates.

Once the actual stage coordinates and the actual deflector coordinates have been determined, the following intermediate matrix shown in Table 6 is formed. The term N in the lower right hand corner of matrix [M] refers to the actual number of chip marks used.

TABLE 6

$$[M] = \begin{pmatrix} \Sigma X'(s,i)X'(s,i) & \Sigma X'(s,i)Y'(s,i) & \Sigma X'(s,i)X'(d,i) & \Sigma X'(s,i)Y'(d,i) & \Sigma X'(s,i) \\ \Sigma X'(s,i)Y'(s,i) & \Sigma Y'(s,i)Y'(s,i) & \Sigma Y'(s,i)X'(d,i) & \Sigma Y'(s,i)Y'(d,i) & \Sigma Y'(s,i) \\ \Sigma X'(s,i)X'(d,i) & \Sigma Y'(s,i)X'(d,i) & \Sigma X'(d,i)X'(d,i) & \Sigma X'(d,i)Y'(d,i) & \Sigma X(d,i) \\ \Sigma X'(s,i)Y'(d,i) & \Sigma Y'(s,i)Y'(d,i) & \Sigma X'(d,i)Y'(d,i) & \Sigma Y'(d,i)Y'(d,i) & \Sigma Y'(d,i) \\ \Sigma X'(s,i) & \Sigma Y'(s,i) & \Sigma X'(d,i) & \Sigma Y'(d,i) & N \end{pmatrix}$$

Next, the intermediate variables A, B, b, $\Delta X$, C, D, c, d, and $\Delta Y$ are calculated as indicated in Table 7 below.

TABLE 7

$$\begin{pmatrix} A \\ B \\ a \\ b \\ \Delta X \end{pmatrix} = [M]^{-1} \begin{pmatrix} \Sigma [X(s,i) + X(d,i)]X'(s,i) \\ \Sigma [X(s,i) + X(d,i)]Y'(s,i) \\ \Sigma [X(s,i) + X(d,i)]X'(d,i) \\ \Sigma [X(s,i) + X(d,i)]Y'(d,i) \\ \Sigma X(i) \end{pmatrix}$$

$$\begin{pmatrix} C \\ D \\ c \\ d \\ \Delta Y \end{pmatrix} = [M]^{-1} \begin{pmatrix} \Sigma [Y(s,i) + Y(d,i)]X'(s,i) \\ \Sigma [Y(s,i) + Y(d,i)]Y'(s,i) \\ \Sigma [Y(s,i) + Y(d,i)]X'(d,i) \\ \Sigma [Y(s,i) + Y(d,i)]Y'(d,i) \\ \Sigma Y(i) \end{pmatrix}$$

Once the matrices of Table 7 have been formed, the offset errors $\Delta X$ and $\Delta Y$ are extracted. As a final step, the stage matrix [M(s)] and deflector matrix [(d)] are formed as indicated in Table 8.

TABLE 8

$$[M(s)] = \begin{pmatrix} A & B \\ C & D \end{pmatrix}^{-1}$$

$$[M(d)] = \begin{pmatrix} a & b \\ c & d \end{pmatrix}^{-1}$$

Once the stage matrix [M(s)] and deflector matrix [M(d)] have been formed, the transformed stage coordinates and deflector coordinates can be calculated as indicated in Table 2 above. While the calculations are somewhat more complex, transforms can also be developed for non-liner distortions, such as the barrel distortion shown in FIG. 11B and the trapezoidal distortion shown in FIG. 11C.

While this invention has been described with reference to several preferred embodiments, it is contemplated that various modifications, alterations, and permutations of the invention will become apparent to those skilled in the art upon a reading of the preceding descriptions and a study of the drawing. It is therefore intended that the scope of the present invention be determined by the following appended claims.

What is claimed is:

1. A method for hybrid integrated circuit lithography, the method comprising the steps of:
   (a) optically exposing an integrated circuit chip to produce optically exposed features including a plurality of chip marks, wherein said integrated circuit chip has an X-axis and a Y-axis, and wherein said chip marks include three chip marks arranged orthogonally to form a right angle proximate a perimeter of said integrated circuit chip;
   (b) sequentially deflecting an E-beam to a plurality of said chip marks while maintaining said integrated circuit chip in a substantially stationary position to obtain numerical deflector parameters, wherein said deflector parameters include the variables: a (the scale change in X), b (the scale change in Y), m (the rotational error of the X axis), and n (the rotational error of the Y axis);
   (c) moving said integrated circuit chip with the object of sequentially aligning a plurality of said chip marks with a substantially stationary E-beam to obtain a plurality of numerical stage parameters, wherein said stage parameters, include the variables: a' (the scale change in X), b' (the scale change in Y), m' (the rotational error of the X axis), and n' (the rotational error of the Y axis);
   (d) numerically computing corrections to E-beam exposure data utilizing both said deflector parameters and said stage parameters; and
   (e) E-beam exposing said integrated circuit chip to produce E-beam exposed features, wherein said computed corrections to said E-beam exposure data are used in the control of said E-beam exposing step.

2. The method defined in claim 8, wherein said step of computing corrections further includes:
   forming a deflector matrix M(D) and a stage matrix M(s) as follows:

$$M(d) = \begin{bmatrix} a & -n \\ m & b \end{bmatrix}; \text{ and } M(s) = \begin{bmatrix} a' & -n' \\ m' & b' \end{bmatrix}.$$

3. The method defined in claim 2, wherein:
   (a) said E-beam exposure data further includes deflector coordinates including X(d) and Y(d), and stage coordinates including X(s) and Y(s); and
   (b) said step of computing corrections further includes computing transformed deflector coordinates X'(d) and Y'(d), and computing transformed stage coordinates including X'(S) and Y'(s) as follows:

$$\begin{bmatrix} X'(d) \\ Y'(d) \end{bmatrix} = M(d) \begin{bmatrix} X(d) \\ Y(d) \end{bmatrix}; \text{ and } \begin{bmatrix} X'(s) \\ Y'(s) \end{bmatrix} = M(s) \begin{bmatrix} X(s) \\ Y(s) \end{bmatrix}.$$

4. The method defined in claim 2, wherein:
   (a) said stage parameters further include delta X(s) and delta Y(s);
   (b) said E-beam exposure data further include deflector coordinates including X(d) and Y(d), and stage corrdinates including X(s) and Y(s); and
   (c) said step of computing corrections further includes computing transformed deflector coordinates X'(d) and Y'(d), and computing transformed stage coordinates including X'(s) and Y'(s) as follows:

$$\begin{bmatrix} X'(d) \\ Y'(d) \end{bmatrix} = M(d) \begin{bmatrix} X(d) \\ Y(d) \end{bmatrix}; \text{ and}$$

$$\begin{bmatrix} X'(s) \\ Y'(s) \end{bmatrix} = M(s) \begin{bmatrix} X(s) - \text{delta } X(s) \\ Y(s) - \text{delta } Y(s) \end{bmatrix}.$$

5. The method defined in claim 2, wherein:
   (a) said deflector parameters further include delta X(d) and delta Y(d);
   (b) said E-beam exposure data further include deflector coordinates including X(d) and Y(d), and stage coordinates including X(s) and Y(s); and
   (c) said step of computing corrections further includes computing transformed deflector coordinates X'(d) and Y'(d), and computing transformed stage coordinates including X'(s) and Y'(s) as follows:

$$\begin{bmatrix} X'(d) \\ Y'(d) \end{bmatrix} = M(d) \begin{bmatrix} X(d) - \text{delta } X(d) \\ Y(d) - \text{delta } Y(d) \end{bmatrix}; \text{ and}$$

$$\begin{bmatrix} X'(s) \\ Y'(s) \end{bmatrix} = M(s) \begin{bmatrix} X(s) \\ Y(s) \end{bmatrix}.$$

6. The method defined in claim 2, wherein:
   (a) said stage parameters further include delta X(s) and delta Y(s), and said deflector parameters further include delta X(d) and delta Y(d);
   (b) said E-beam exposure data further includes deflector coordinates including X(d) and Y(d), and stage coordinates further include X(s) and Y(s); and
   (c) said step of computing corrections further includes computing transformed deflector coordinates X'(d) and Y'(d), and computing transformed stage coordinate including X'(s) and Y'(s) as follows:

$$\begin{bmatrix} X'(d) \\ Y'(d) \end{bmatrix} = M(d) \begin{bmatrix} X(d) - \text{delta } X(d) \\ Y(d) - \text{delta } Y(d) \end{bmatrix}; \text{ and}$$

$$\begin{bmatrix} X'(s) \\ Y'(s) \end{bmatrix} = M(s) \begin{bmatrix} X(s) - \text{delta } X(s) \\ Y(s) - \text{delta } X(s) \end{bmatrix}.$$

7. The method defined in claim 3, wherein:
a chip mark e has coordinates,
a chip mark f has coordinates, and
a chip mark g has coordinates; wherein
chip mark e is a corner chip mark of said right angle,
chip mark f is primarily displaced in an X direction relative to said chip ark e, and
chip mark g is primarily displaced in a Y direction relative to said chip mark e; and
wherein said right angle has leg lengths of L; and
wherein a, b, m, n, a', b', m', and n' are calculated as follows:

a=a'=[X(f)−X(e)]/L b=b'=[Y(e)−Y(g)]/L m=m'=[Y(f)−Y(e)]/L n=n'=[X(g)−X(e)]/L, whereby a, b, m, and n are determined primarily by deflection of said E-beam, and
wherein a', b', m', and n' are determined primarily by movement of said integrated circuit chip.

8. A method for aligning an E-beam lithographic exposure of an integrated circuit chip with a pre-existing optical lithographic exposure of said integrated circuit chip which had produced both chip features and chip marks having a fixed spatial relationship relative to said chip features; said method comprising the steps of:
moving said integrated circuit chip until a substantially stationary E-beam is positioned within deflection range of a chip mark and then deflecting said E-beam to said chip mark to determine a numerical compound parameter which includes information about both the stage movement and the deflector movement that were required to access said chip mark;
repeating the previous step until a plurality of compound parameters have been determined; and
exposing said integrated circuit chip with said E-beam utilizing said plurality of compound parameters in numerical calculations regarding the deflection of said E-beam and the movement of said integrated circuit chip.

9. A method as recited in claim 8 wherein said step of exposing said integrated circuit with said E-beam includes sequentially exposing a plurality of fields within said integrated circuit chip.

10. A method as recited in claim 8 wherein said integrated circuit chip includes a plurality of sides, and wherein said chip marks are provided along two sides of said integrated circuit chip.

11. A method as recited in claim 10 wherein said two sides are adjacent.

12. A method as recited in claim 8 wherein said chip marks are provided along more than two sides of said integrated circuit chip.

13. A method for hybrid integrated circuit lithography comprising the steps of:
optically exposing an integrated circuit chip to produce optically exposed feature s including a plurality of chip marks;
moving said integrated circuit chip within deflection range of a chip mark and then deflecting an E-beam to said chip mark to determine a numerical compound parameter which includes information about both the stage movement and the deflector movement that were required to access said chip mark;
repeating the previous step until a plurality of compound parameters have been determined;
computing corrections to E-beam exposure data utilizing said compound parameters; and
E-beam exposing said integrated circuit chip to produce E-beam exposed features, wherein said computed corrections to said E-beam exposure data are used in the control of said E-beam exposing step.

14. A method for hybrid integrated circuit lithography as recited in claim 13 wherein said E-beam exposure data includes deflector coordinates including X(d) and Y(d), and stage coordinates including X(s) and Y(s); and wherein said step of computing corrections further includes computing transformed deflector coordinates X'(d) and Y'(d) utilizing a deflector matrix M(d), and computing transformed stage coordinates including X'(s) and Y'(s) using a stage matrix M(s).

15. A method for hybrid integrated circuit lithography as recited in claim 14 wherein X'(d), Y'(d), X'(s), and Y'(s) are computed using the following transforms:

$$\begin{bmatrix} X'(d) \\ Y'(d) \end{bmatrix} = M(d) \begin{bmatrix} X(d) \\ Y(d) \end{bmatrix}; \text{ and } \begin{bmatrix} X'(s) \\ Y'(s) \end{bmatrix} = M(s) \begin{bmatrix} X(s) \\ Y(s) \end{bmatrix}$$

16. A method for hybrid integrated circuit lithography as recited in claim 14 wherein said said compound parameters further include ΔX(s) and ΔY(s), and wherein X'(d), Y'(d), X'(s), and Y'(s) are computed using the following transforms:

$$\begin{bmatrix} X'(d) \\ Y'(d) \end{bmatrix} = M(d) \begin{bmatrix} X(d) \\ Y(d) \end{bmatrix}; \text{ and } \begin{bmatrix} X'(s) \\ Y'(s) \end{bmatrix} = M(s) \begin{bmatrix} X(s) - \Delta X(s) \\ Y(s) - \Delta Y(s) \end{bmatrix}$$

17. A method for hybrid integrated circuit lithography as recited in claim 14 wherein said compound parameters include ΔX(d) and ΔY(d), wherein X'(d), Y'(d), X'(s), and Y'(s) are computed using the following transforms:

$$\begin{bmatrix} X'(d) \\ Y'(d) \end{bmatrix} = M(d) \begin{bmatrix} X(d) - \Delta X(d) \\ Y(d) - \Delta Y(d) \end{bmatrix}; \text{ and } \begin{bmatrix} X'(s) \\ Y'(s) \end{bmatrix} = M(s) \begin{bmatrix} X(s) \\ Y(s) \end{bmatrix}$$

18. A method for hybrid integrated circuit lithography as recited in claim 14 wherein said compound parameters include $\Delta X(s)$ and $\Delta Y(s)$, and wherein $X'(d)$, $Y'(d)$, $X'(s)$, and $Y'(s)$ are computed using the following transforms:

$$\begin{bmatrix} X'(d) \\ Y'(d) \end{bmatrix} = M(d) \begin{bmatrix} X(d) - \Delta X(d) \\ Y(d) - \Delta Y(d) \end{bmatrix} ; \text{ and}$$

$$\begin{bmatrix} X'(s) \\ Y'(s) \end{bmatrix} = M(s) \begin{bmatrix} X(s) - \Delta X(s) \\ Y(s) - \Delta Y(s) \end{bmatrix}$$

19. A method for hybrid integrated circuit lithography as recited in claim 22 wherein said E-beam exposure data includes pattern stage coordinates $X(s,i)$ and $Y(s,i)$, and pattern deflector coordinates $X(d,i)$ and $Y(d,i)$; and wherein said step of computing corrections further includes repeating the step of sequentially moving said integrated circuit chip within deflection range of a chip mark and then deflecting an E-beam to said chip mark to determine a plurality of compound parameters at least five times to determine stage control parameters $X'(s,i)$ and $Y'(s,i)$; and deflector control parameters $X'(d,i)$ and $Y'(d,i)$.

20. A method for hybrid integrated circuit lithography as recited in claim 14 wherein said E-beam expoing corrections further includes the step of forming an intermediate matrix as follows:

$$[M] = \begin{pmatrix} \Sigma X'(s,i)X'(s,i) & \Sigma X'(s,i)Y'(s,i) & \Sigma X'(s,i)X'(d,i) & \Sigma X'(s,i)Y'(d,i) & \Sigma X'(s,i) \\ \Sigma X'(s,i)Y'(s,i) & \Sigma Y'(s,i)Y'(s,i) & \Sigma Y'(s,i)X'(d,i) & \Sigma Y'(s,i)Y'(d,i) & \Sigma Y'(s,i) \\ \Sigma X'(s,i)X'(d,i) & \Sigma Y'(s,i)X'(d,i) & \Sigma X'(d,i)X'(d,i) & \Sigma X'(d,i)Y'(d,i) & \Sigma X(d,i) \\ \Sigma X'(s,i)Y'(d,i) & \Sigma Y'(s,i)Y'(d,i) & \Sigma X'(d,i)Y'(d,i) & \Sigma Y'(d,i)Y'(d,i) & \Sigma Y'(d,i) \\ \Sigma X'(s,i) & \Sigma Y'(s,i) & \Sigma X'(d,i) & \Sigma Y'(d,i) & N \end{pmatrix}$$

21. A method for hybrid integrated circuit lithography as recited in claim 20 wherein said step of computing corrections further includes the step of calculating intermediate variables A, B, a, b, C, D, c, and as well as offset variables $\Delta X$ and $\Delta Y$ as follows:

$$\begin{pmatrix} A \\ B \\ a \\ b \\ \Delta X \end{pmatrix} = [M]^{-1} \begin{pmatrix} \Sigma [X(s,i) + X(d,i)]X'(s,i) \\ \Sigma [X(s,i) + X(d,i)]Y'(s,i) \\ \Sigma [X(s,i) + X(d,i)]X'(d,i) \\ \Sigma [X(s,i) + X(d,i)]Y'(d,i) \\ \Sigma X(i) \end{pmatrix} ; \text{ and}$$

$$\begin{pmatrix} C \\ D \\ c \\ d \\ \Delta Y \end{pmatrix} = [M]^{-1} \begin{pmatrix} \Sigma [Y(s,i) + Y(d,i)]X'(s,i) \\ \Sigma [Y(s,i) + Y(d,i)]Y'(s,i) \\ \Sigma [Y(s,i) + Y(d,i)]X'(d,i) \\ \Sigma [Y(s,i) + Y(d,i)]Y'(d,i) \\ \Sigma Y(i) \end{pmatrix}$$

22. A method for hybrid integrated circuit lithography as recited in claim 21 further comprising the step of extracting the offset errors $\Delta X$ and $\Delta Y$; and calculating the stage matrix and the deflector matrix as follows:

$$[M(s)] = \begin{pmatrix} A & B \\ C & D \end{pmatrix}^{-1} ; \text{ and}$$

$$[M(d)] = \begin{pmatrix} a & b \\ c & d \end{pmatrix}^{-1}$$

23. An apparatus for hybrid lithography comprising:
stage means supporting an integrated circuit wafer adapted for the production of at least one integrated circuit chip, said stage means being movable in a substantially constant plane;
E-beam means including an electron source and deflector means for deflecting the path of said E-beam generated by said electron source;
electron detector means responsive to a reflected portion of said E-beam;
storage means including a pattern data base and a correction data base, said correction data base including a stage correction data base and a defector correction data base; wherein said stage correction data base stores data derived, at least in part, from movement of said stage means, and said deflector correction data base stores data derived, at least in part, from deflection of said E-beam; and
control means coupled to said stage means, said E-beam means, said electron detector, and said storage means; wherein said control means utilizes said stage means, said E-beam means, and said electron detector to determine and store data to said correction data base; and where said control means utilizes said pattern data base, said stage correction data base, and said deflector correction data base in numerical computations to control said stage means and said E-beam means.

24. An apparatus for hybrid lithography as recited in claim 23 wherein said control means includes digital computation means coupled to said storage means, and interface means coupling said digital computation means to said stage means, said E-beam means, and said electron detector means.

25. An apparatus for hybrid lithography as recited in claim 24 wherein said control means includes digital computation means coupled to said storage means, and interface means coupling said digital computation means to said stage means, said E-beam means, and said electron detector means.

26. An apparatus for hybrid lithography as recited in claim 24 wherein said digital computation -means transforms said pattern data base utilizing a deflector matrix M(d) and a stage matrix M(s) derived from said correction data base.

27. An apparatus for hybrid integrated circuit lithography as recited in claim 26 wherein said pattern data base includes deflector coordinates including $X(d)$ and $Y(d)$, and stage coordinates including $X(s)$ and $Y(s)$; and wherein said digital computation means calculates transformed deflector coordinates $X'(d)$ and $Y'(d)$ and transformed stage coordinates including $X'(s)$ and $Y'(s)$ as follows:

$$\begin{bmatrix} X'(d) \\ Y'(d) \end{bmatrix} = M(d) \begin{bmatrix} X(d) \\ Y(d) \end{bmatrix}; \text{ and } \begin{bmatrix} X'(s) \\ Y'(s) \end{bmatrix} = M(s) \begin{bmatrix} X(s) \\ Y(s) \end{bmatrix}$$

28. An apparatus for hybrid integrated circuit lithography as recited in claim 26 wherein said correction data base further includes $\Delta X(s)$ and $\Delta Y(s)$; and wherein said pattern data base includes deflector coordinates including $X(d)$ and $Y(d)$, and stage coordinates including $X(s)$ and $Y(s)$; and wherein said digital computation means calculates transformed deflector coordinates $X'(d)$ and $Y'(d)$ and transformed stage coordinates including $X'(s)$ and $Y'(s)$ as follows:

$$\begin{bmatrix} X'(d) \\ Y'(d) \end{bmatrix} = M(d) \begin{bmatrix} X(d) \\ Y(d) \end{bmatrix}; \text{ and } \begin{bmatrix} X'(s) \\ Y'(s) \end{bmatrix} = M(s) \begin{bmatrix} X(s) - \Delta X(s) \\ Y(s) - \Delta Y(s) \end{bmatrix}$$

29. An apparatus for hybrid integrated circuit lithography as recited in claim 26 wherein said correction data base further includes $\Delta X(s)$ and $\Delta Y(s)$; and wherein said pattern data base includes deflector coordinates including $X(d)$ and $Y(d)$, and stage coordinates including $X(s)$ and $Y(s)$; and wherein said digital computation means calculates transformed deflector coordinates $X'(d)$ and $Y'(d)$ and transformed stage coordinates including $X'(s)$ and $Y'(s)$ as follows:

$$\begin{bmatrix} X'(d) \\ Y'(d) \end{bmatrix} = M(d) \begin{bmatrix} X(d) - \Delta X(d) \\ Y(d) - \Delta Y(d) \end{bmatrix}; \text{ and } \begin{bmatrix} X'(s) \\ Y'(s) \end{bmatrix} = M(s) \begin{bmatrix} X(s) \\ Y(s) \end{bmatrix}$$

30. An apparatus for hybrid integrated circuit lithography as recited in claim 26 wherein said correction data base further includes $\Delta X(s)$ and $\Delta Y(s)$; and wherein said pattern data base includes deflector coordinates including $X(d)$ and $Y(d)$, and stage coordinates including $X(s)$ and $Y(s)$; and wherein said digital computation means calculates transformed deflector coordinates $X'(d)$ and $Y'(d)$ and transformed stage coordinates including $X'(s)$ and $Y'(s)$ as follows:

$$\begin{bmatrix} X'(d) \\ Y'(d) \end{bmatrix} = M(d) \begin{bmatrix} X(d) - \Delta X(d) \\ Y(d) - \Delta Y(d) \end{bmatrix}; \text{ and}$$

$$\begin{bmatrix} X'(s) \\ Y'(s) \end{bmatrix} = M(s) \begin{bmatrix} X(s) - \Delta X(s) \\ Y(s) - \Delta Y(s) \end{bmatrix}$$

31. An apparatus for hybrid lithography as recited in claim 23 further comprising optical lithography means for producing optically exposed features on said integrated circuit wafer.

32. An apparatus for hybrid lithography as recited in claim 31 further comprising transport means for transporting said integrated circuit wafer between said optical lithography means and said stage means.

* * * * *

UNITED STATES PATENT AND TRADEMARK OFFICE
CERTIFICATE OF CORRECTION

PATENT NO. : 4,812,661

DATED : Mar. 14, 1989

INVENTOR(S) : Geraint Owen

It is certified that error appears in the above-identified patent and that said Letters Patent is hereby corrected as shown below:

Column 6, line 60, "he" should read -- the --

Column 13, line 65, "Claim 8" should read -- Claim 1 --

Column 15, line 19, "ark" should read -- mark --

Column 16, line 17, "feature s" should read -- features --

Column 17, line 16, "22" should read -- 14 --

Column 17, lines 27-28, "E-beam expoing" should read -- steps of computing --

Column 17, line 29, "matrix" should read -- matrix [M] --

Column 18, line 19, "defector" should read -- deflector --

Column 18, line 51, "24" should read -- 23 --

Signed and Sealed this

Eleventh Day of December, 1990

Attest:

HARRY F. MANBECK, JR.

*Attesting Officer*  *Commissioner of Patents and Trademarks*